United States Patent
Landis

(10) Patent No.: US 7,479,701 B2
(45) Date of Patent: Jan. 20, 2009

(54) DUMMY METAL FILL SHAPES FOR IMPROVED RELIABILITY OF HYBRID OXIDE/LOW-K DIELECTRICS

(75) Inventor: Howard S. Landis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 294 days.

(21) Appl. No.: 11/330,203

(22) Filed: Jan. 12, 2006

(65) Prior Publication Data

US 2006/0118960 A1 Jun. 8, 2006

Related U.S. Application Data

(62) Division of application No. 10/605,891, filed on Nov. 4, 2003, now Pat. No. 7,015,582.

(60) Provisional application No. 60/320,074, filed on Apr. 1, 2003.

(51) Int. Cl.
*H01L 23/52* (2006.01)
*H01L 23/48* (2006.01)

(52) U.S. Cl. ............ 257/758; 257/760; 257/362; 257/774; 257/750; 438/455; 438/15; 438/10; 438/118; 438/622

(58) Field of Classification Search .......... 257/758, 257/760, 762, 774, 750; 438/455, 15, 10, 438/118, 622
See application file for complete search history.

(56) References Cited

U.S. PATENT DOCUMENTS

| | | | |
|---|---|---|---|
| 5,032,890 A | 7/1991 | Ushiku et al. | |
| 5,278,105 A | 1/1994 | Eden et al. | |
| 5,675,187 A | 10/1997 | Numata et al. | |
| 5,818,111 A | 10/1998 | Jeng et al. | |
| 6,114,186 A | 9/2000 | Jeng et al. | |
| 6,258,715 B1 | 7/2001 | Yu et al. | |
| 6,287,979 B1 | 9/2001 | Zhou et al. | |
| 6,309,956 B1 | 10/2001 | Chirang et al. | |
| 6,468,894 B1 | 10/2002 | Yang et al. | |
| 6,660,618 B1 * | 12/2003 | Chen et al. ............ | 438/584 |
| 6,727,588 B1 * | 4/2004 | Abdelgadir et al. ..... | 257/751 |
| 2003/0094696 A1 * | 5/2003 | Dunham et al. ......... | 257/758 |
| 2003/0107134 A1 | 6/2003 | Lee | |
| 2004/0164339 A1 * | 8/2004 | Felsner et al. ........... | 257/307 |
| 2004/0175921 A1 * | 9/2004 | Cowley et al. .......... | 438/622 |
| 2004/0207091 A1 | 10/2004 | Wang et al. | |

* cited by examiner

*Primary Examiner*—Kenneth A Parker
*Assistant Examiner*—Joseph Nguyen
(74) *Attorney, Agent, or Firm*—Anthony J. Canale; Greenblum & Bernstein P.L.C.

(57) ABSTRACT

Semiconductor structure including a first rigid dielectric layer and a second rigid dielectric layer. A first non-rigid low-k dielectric layer is formed between the first and second rigid dielectric layer. A plurality of dummy fill shapes is formed in the first non-rigid layer which replace portions of the first non-rigid low-k dielectric layer with lower coefficient of thermal expansion (CTE) metal such that an overall CTE of the first non-rigid low-k dielectric layer and the plurality of dummy fill shapes matches a CTE of the first and second rigid dielectric layers more closely than that of the first non-rigid low-k dielectric layer alone.

11 Claims, 4 Drawing Sheets

US 7,479,701 B2

DUMMY METAL FILL SHAPES FOR IMPROVED RELIABILITY OF HYBRID OXIDE/LOW-K DIELECTRICS

CROSS REFERENCE TO RELATED APPLICATIONS

The present application is a divisional of U.S. application Ser. No. 10/605,891 filed Nov. 4, 2003, now U.S. Pat. No. 7,015,582 the disclosure of which is expressly incorporated by reference herein in its entirety, which, in turn, claims priority of U.S. provisional application Ser. No. 60/320,074, filed on Apr. 1, 2003, which is incorporated herein in its entirety.

BACKGROUND OF INVENTION

1. Field of the Invention

The invention generally relates to a semiconductor device and method of manufacture and, more particularly, to a semiconductor device and method of manufacture which reduces mismatch driven stresses and deflections between interconnect layers.

2. Background Description

To fabricate microelectronic semiconductor devices such as an integrated circuit (IC), many different layers of metal and insulation are selective deposited on a silicon wafer. The insulation layers may be, for example, silicon dioxide, silicon oxynitride, fluorinated silicate glass (FSG) and the like. These insulation layers are deposited between the metal layers, i.e., intermetal dielectric (IMD) layers, and may act as electrical insulation therebetween or serve other known functions. These layers are typically deposited by any well known method such as, for example, plasma enhanced chemical vapor deposition (PECVD), chemical vapor deposition (CVD) or other processes.

The metal layers are interconnected by metallization through vias etched in the intervening insulation layers. To accomplish this, the stacked layers of metal and insulation undergo photolithographic processing to provide a pattern consistent with a predetermined IC design. By way of example, the top layer may be covered with a photo resist layer of photo-reactive polymeric material for patterning via a mask. A photolithographic process using either visible or ultraviolet light is then directed through the mask onto the photo resist layer to expose it in the mask pattern. An antireflective coating (ARC) layer such as polyimide may be provided at the top portion of the wafer substrate to minimize reflection of light back to the photo resist layer for more uniform processing. The etching may be performed by anisotropic or isotropic etching as well as wet or dry etching, depending on the physical and chemical characteristics of the materials. Regardless of the fabrication process, to maximize the integration of the device components in very large scale integration (VLSI), it is necessary to increase the density of the components.

Although silicon dioxide material has been used as an insulating material due to its thermal stability and mechanical strength, in recent years it has been found that better device performance may be achieved by using a lower dielectric constant material. By using a lower dielectric constant material, a reduction in the capacitance of the structure can be achieved which, in turn, increases the device speed.

The use of organic low-k dielectric materials such as, for example, SiLK (manufactured by Dow Chemical Co., Midland, Mich.) for semiconductor interconnect isolation tend to have a higher coefficient of thermal expansion (CTE) and lower mechanical strength than conventional dielectric materials such as, for example, silicon oxide. By building a hybrid oxide/low-k dielectric stack, where the via levels are fabricated in oxide (e.g., FSG) and the wiring levels are fabricated in low-k material (e.g., SiLK), the large intralevel line-to-line component of wiring capacitive coupling is reduced, thus maximizing the positive benefit of the low-k material while improving the overall robustness and reliability of the finished structure. The hybrid oxide/low-k dielectric stack structure is much more robust than an "all low-k" dielectric stack, which is known to be relatively more susceptible to via resistance degradation or via delamination due to thermal cycle stresses driven by the high CTE of organic and semi-organic low-k dielectrics.

Nonetheless, even with a hybrid oxide/low-k dielectric stack structure, large regions of low-k dielectric (i.e., lateral extents on the order of about ten times the metal film thickness) without any interconnects tend to expand and contract vertically due to its response to increases and decreases in the ambient temperature, respectively. The expansion and contraction of the low-k dielectric causes the adjacent oxide layers to deflect, thus creating feature-dependent stress concentrations at interconnects/vias, especially at the edges of the large regions. Any interconnect/via connections in these edge regions are susceptible to resistance shifts and via opens due to repeated deflections from thermal cycling during manufacture, reliability stressing, and use. For a large enough deflection, a via can separate from the interconnect which it was attached causing a very large increase in resistance or a persistent electric open.

Currently, there are no known methods to increase the strength and robustness of the structure. For example, dummy fill shapes are known in the industry for use in silicon oxide dielectric based structures but in these structures, the dummy fill shapes are used for processing purposes such as to prevent undulations in the upper layer of the structure during planarization processes. These dummy fill shapes do not prevent delamination or add strength to the structure as evidenced by the placement of these structures within the interconnect layer. For example, it is known that dummy fill shapes, as they are presently used in the industry, are deliberately placed away from any metal lines due to the relative difficulty in obtaining the proper manufacturing tolerances. In fact, the standard use of the dummy fill shapes was intended to be used with dielectric materials which had a higher strength than the dummy metal fill shapes, themselves. This, of course, could not then provide any additional strength to the structure.

SUMMARY OF INVENTION

In a first aspect of the invention, a semiconductor structure is formed on a substrate. The structure includes a first and second rigid dielectric layer and a first non-rigid dielectric wiring level between such layers. The non-rigid layer includes at least one interconnect. A structural securing means is associated with the non-rigid dielectric wiring level for preventing a portion of the first or second rigid dielectric layers adjacent the interconnect from de-layering away from the interconnect and for preventing undue stresses or delamination of via/metal interfaces. In one aspect, the structural securing means are dummy fill shapes in proximity to the interconnect which have a coefficient of thermal expansion substantially the same as the first and second rigid dielectric layer. In one aspect, the dummy fill shapes improve the mechanical stability of the structure relative to the dielectric.

In another aspect of the invention, the semiconductor structure includes a first rigid dielectric layer a second rigid dielectric layer and a first non-rigid low-k dielectric layer formed between the first and second rigid dielectric layer. A plurality of dummy fill shapes are formed in the first non-rigid layer which replace portions of the first non-rigid low-k dielectric layer with lower coefficient of thermal expansion (CTE) metal such that an overall CTE of the non-rigid low-k dielectric layer and the plurality of dummy fill shapes better matches a CTE of the first and second rigid dielectric layer.

The first and second dielectric layer and the first non-rigid layer may have stresses and deflections which tends toward zero. The plurality of dummy metal fill shapes may reduce temperature-driven stress between the first and second rigid dielectric layer and the first non-rigid low-k dielectric layer.

The semiconductor structure may further comprise a substrate and at least one front-end-of-line (FEOL) device formed on the substrate, the first rigid dielectric layer is formed on the FEOL.

The plurality of dummy metal fill shapes may be substantially composed of one of an alloy of copper, tungsten and aluminum and extend between a bottom surface of the second rigid dielectric layer and top surface of the first rigid dielectric layer, and the first and second rigid dielectric layer comprise a silicon oxide based glass.

The semiconductor structure may further comprise a second non-rigid low-k dielectric layer formed on the second rigid dielectric layer, a third rigid dielectric layer formed on the second non-rigid low-k dielectric layer, a metal interconnect extending between the second and third rigid dielectric layer and formed in the second non-rigid low-k dielectric layer, and at least one dummy fill shape formed in the second non-rigid low-k dielectric layer in proximity to the metal interconnect, wherein the at least one dummy fill shape is formed of a material such that an overall CTE of the at least one dummy fill shape better matches to the second and third rigid dielectric layer than that of the second non-rigid low-k dielectric layer.

In still a further aspect of the invention, a structure includes a substrate and at least one front-end-of-line (FEOL) device formed on the substrate. A first rigid layer comprising a dielectric is formed on the at least one FEOL device. A first non-rigid layer comprising a low-k dielectric siloxane based semi-organic layer is formed on the first rigid layer and a second rigid layer comprising a dielectric is formed on the first non-rigid layer. A second non-rigid layer comprising a low-k dielectric is formed on the second rigid layer and a third rigid layer is formed on the second non-rigid layer. At least one interconnect is formed in the second non-rigid layer extending between the second and third rigid layer. At least one dummy fill shape is formed in the second non-rigid layer extending between the second and third rigid layer. The at least one dummy fill shape is composed of an alloy having a coefficient of thermal expansion (CTE) that better matches a CTE of the second and third rigid layer such that the at least one dummy fill shape prevents a portion of the second and the third rigid layers adjacent the interconnect from de-layering away from the interconnect.

In still another aspect of the invention, a process is provided for forming a semiconductor structure. The process includes forming a first rigid dielectric layer on a substrate and forming a first non-rigid dielectric wiring level on the first rigid dielectric layer having an interconnect. A second rigid dielectric layer is formed on the first non-rigid dielectric wiring level and a plurality of dummy metal fill shapes are formed in the first non-rigid dielectric wiring level in proximity to the interconnect. The dummy metal fill shapes prevent a portion of the first or second rigid dielectric layers adjacent the interconnect from de-layering away from the interconnect.

DETAILED DESCRIPTION

This invention is directed to a semiconductor device and method of manufacture for preventing de-layering of an adjacent oxide layer away from an interconnect. The invention, in one aspect, uses dummy fill shapes to provide a solution to the problem of locally-high stresses and deflections near metallization structures bounding regions initially devoid of metal shapes. This is accomplished by replacing portions of the high coefficient of thermal expansion material (CTE)/low-k material with relatively low CTE metal such as copper. In this manner, the effective CTE of the region is reduced in proportion to the density of the dummy metal fill shapes. It has also been found that the use of the dummy fill shapes improve the mechanical stress and stiffness of the structure since they tend to adhere between the upper and lower dielectric layers. A benefit that is derived from the invention is significantly improved reliability and robustness of the interconnects.

By use of the invention, the overall CTE of such a region will substantially or exactly match the CTE of any nearby region having the same metal density. Thus, if the density of the dummy metal fill shapes is matched to the overall average local metal density, CTE mismatch stresses and deflections tend to be zero. This has the effect of reducing the tendency for temperature-driven stress. Also, the use of the dummy fill shapes, connecting together silicon oxide layers above and below the dummy metal filled low-k dielectric layer, effectively inhibits the silicon oxide layers from deflecting and also prevents propagation of cracks. This has the effect to reduce the deflections associated with any remaining stresses. The dummy fill shapes also have the effect of providing additional mechanical strength to the structure due to its increase stiffness and better adhesion properties compared to the low-k dielectric layer. The invention thus offers the advantage of allowing even lower-k material to be used with equivalent or better manufacturability, robustness and reliability resulting in higher chip performance.

Figure 1A:
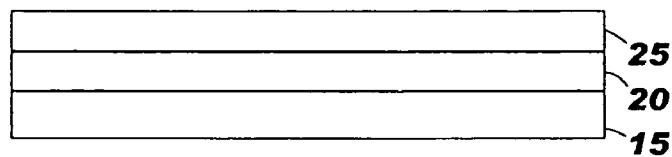
FIGS. 1a through 1e represent a fabrication process to form a device in accordance with the invention.

Referring to FIG. 1a, a semiconductor structure is formed on substrate 15 such as, for example, silicon, silicon-on-insulator (SOI), and silicon germanium (SiGe). Front-end-of-line (FEOL) devices 20 are formed on the substrate 15 and are connected by subsequently formed interconnects. Rigid layer 25 comprising a dielectric such as, for example, silicon oxide is formed on the FEOL devices 20 by any known process such as, for example, chemical vapor deposition.

Figure 1B:
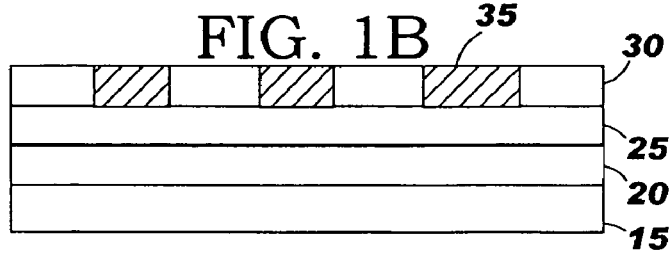

FIG. 1b shows the deposition of a non-rigid layer 30 comprising a low-k dielectric such as a siloxane based semi-organic layer or other known materials. In one application, the low-k dielectric is SiLK. It is known that low-k dielectrics are fragile, i.e., mechanically weaker than oxide layers, less stiff than oxide, i.e., have greater deflection at a given load, and do not have the ability to withstand higher loads. It is also known that these materials have an inverse proportional relationship with regard to their electrical properties such that better electrical properties, i.e., the lower dielectric constants, result in poor mechanical properties such as lower stiffness and lower strength.

Additional low-k dielectrics may include OSG materials, or organosilicate glass; often represented as SiCOH or $SiC_x\text{-}O_yH_z$. OSG can be bulk or porous, and can be applied to a wafer by spin-on or by CVD (chemical vapor deposition). Additional materials may be porous silicon dioxide ("aerogel"), HSQ, or hydrogen silsesquioxane, Teflon®. or florinated hydrocarbon polymer. All of these materials, like SiLK (which is a spin-on OSG), are mechanically weaker and less stiff than a conventional silicon dioxide glass. They all also have CTE significantly larger than the CTE of conventional silicon dioxide glass.

But, in the invention, the low-k dielectric layer 30 is patterned to form dummy fill shapes 35 by any known process such as, for example, a damascene process. In one aspect of the invention, the dummy fill shapes 35 comprise a material such as, for example, a metal alloy predominantly composed of copper, aluminum or tungsten. In one aspect of the invention, the dummy material is better matched to the dielectric layer 25 than to the interconnect region as a whole than the low-k layer 30 is matched to the dielectric layer 25 to the interconnect region as a whole. This reduces the local stresses and deflections associated with the structure. Although multiple dummy metal fill shapes are shown in FIG. 1b, it should be recognized by those of ordinary skill in the art that regions so small as to receive only one dummy fill shape can also obtain the advantages of the invention.

Figure 1C:
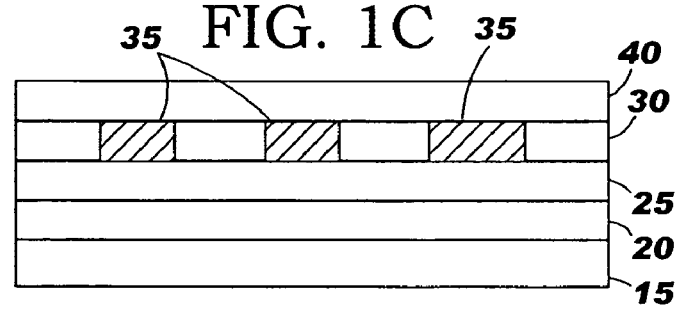
Figure 1D:
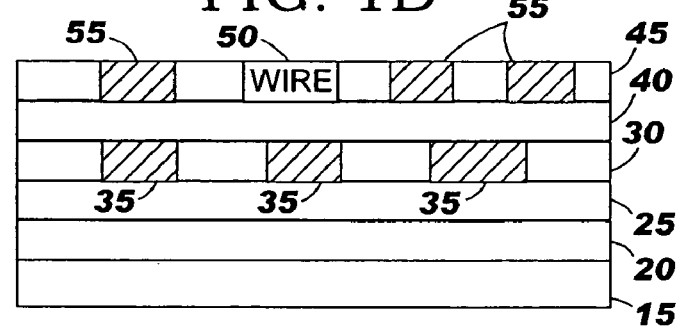

FIG. 1c shows a rigid layer 40 comprising a dielectric such as, for example, silicon oxide formed on the low-k dielectric layer 30. A non-rigid layer 45 comprising a low-k dielectric such as, for example, SiLK is then formed on the silicon oxide layer 40. (FIG. 1d). The low-k dielectric layer 45 is patterned to form interconnect 50 and dummy fill shapes 55 by any known process such as, for example, a damascene process. The interconnect 50 and dummy fill shapes 55 comprise a material such as, for example, a metal including copper.

It should be recognized by those of ordinary skill in the art that the copper interconnect 50 has a lower surface in contact with a portion of the silicon oxide layer 40, and an upper surface in contact with a portion of silicon oxide layer 60. To prevent de-layering of the contact areas between the interconnect 50 and silicon oxide layers 40, 60, the dummy metal fill shapes 35, 55 and 70 are provided to physically connect the silicon oxide layers to one another. The dummy metal fill shapes 35, 70 are formed in close proximity to the interconnect 50 in order to provide maximum structural support for the copper interconnect 50.

Figure 1E:
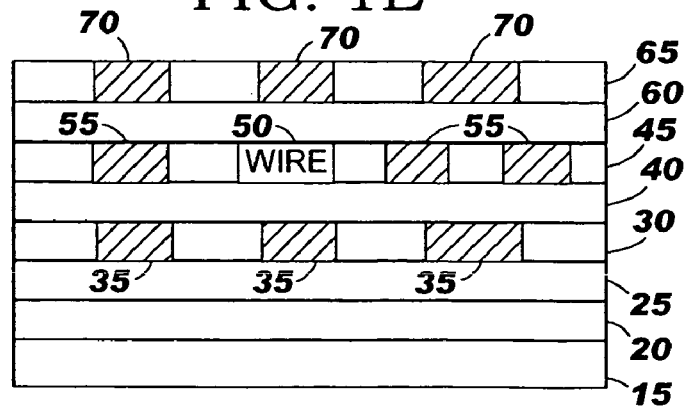
Figure 3:
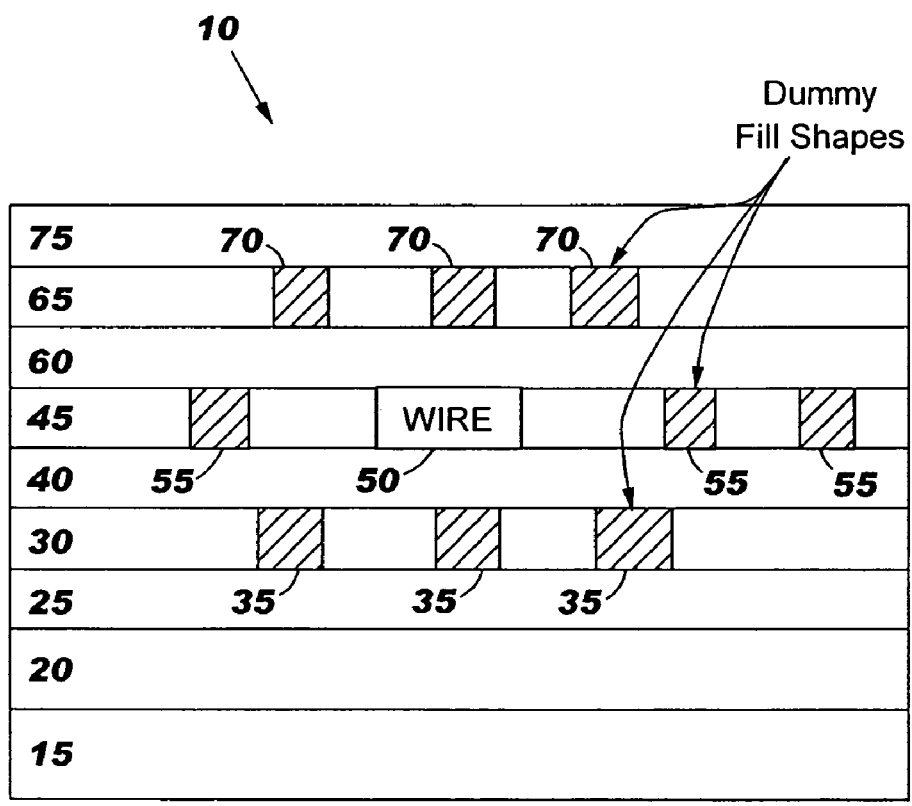
FIG. 3 is a representation of a device formed using the fabrication processes described in FIGS. 1a-1e.

FIG. 1e represents the process steps of FIGS. 1a-1d being repeated to form silicon oxide layer 60, low-k dielectric layer 65 including dummy fill shapes 70 (i.e., copper, aluminum or tungsten), and a silicon oxide layer as is the case with layer 75 in FIG. 3. These same processes can be continually repeated to from further layers, in accordance with the teachings of the invention.

Figure 2A:
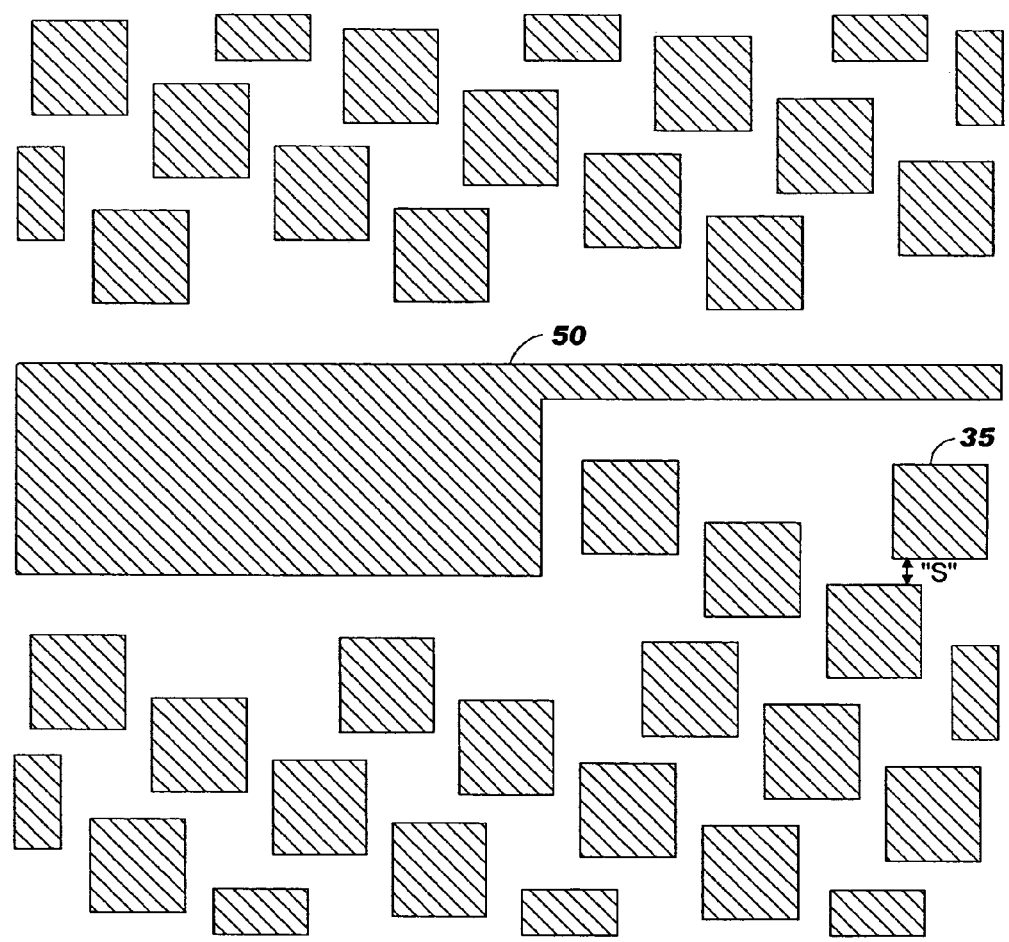
FIG. 2a is a top view of one layer of a device in accordance with the invention.

FIG. 2a is a top view of one layer of a device in accordance with the invention. In one aspect of the invention, several layers may be provided for making the device as discussed with reference to FIGS. 1a-1e. These layers may be designated $M_1, M_2 \ldots M_n$ levels. In one aspect, the interconnect 50 may have a line width from 0.1 micron to greater than 1 micron, depending on the level or layer of the device. For example, the line width of the metal interconnect may be approximately 0.2 microns at an $M_2$ level, 0.4 microns at an $M_8$ level and greater than one micron at the $M_n$ level. As should be readily understood by those of ordinary skill in the art, the line width increases at the higher levels. In one preferred aspect of the invention, the line width may be approximately 0.14 microns at the lowest level nearest the device 20.

As further shown in FIG. 2a, in one aspect of the invention, the dummy fill shapes 35 are immediately adjacent to the interconnect 50 of interest. The dummy metal fill shapes 35 are electrically isolated from each other and the interconnect 50. But, there should preferably be a minimum spacing "S" for each particular level which may be, for example, one to four times the minimum spacing for ordinary wires on that level. In essence, the spacing and shape of the dummy metal fill shapes 35 should not be too small that they cannot be properly printed, in accordance with customary practice. In one aspect, the spacing between the metal interconnect of interest and the dummy metal fill shapes, as well as the spacing between the dummy fill shapes should be equal to the minimum line width for that level. This should provide a density of the dummy fill shapes 35, for example, of approximately between 45% and 50% of that level; however, other densities are also contemplated by the invention in order to reduce the local stresses and maximize the mechanical strength of such layer.

The dummy fill shapes are preferably square and in a staggered offset pattern. In the illustration of FIG. 2, the dummy fill shapes have spaces between them so that the overall density of the dummy fill shapes is approximately 45%. Due to the staggered offset pattern, it is easier to obtain the dummy fill shapes placed close to "real" shapes in the design. For square-shaped dummy features, this arrangement provides optimum close-packing to an arbitrary collection of ortho-normal design shapes. In one aspect, the size (i.e., length and width) of the dummy metal fill shapes may be 3.times. the minimum line width for the level. By way of example, if the minimum line width is 0.2 microns for the interconnect, then the dummy fill shapes would be approximately 0.6 microns by 0.6 microns. Of course, other dimensions are also contemplated in accordance with the invention.

Figure 2B:
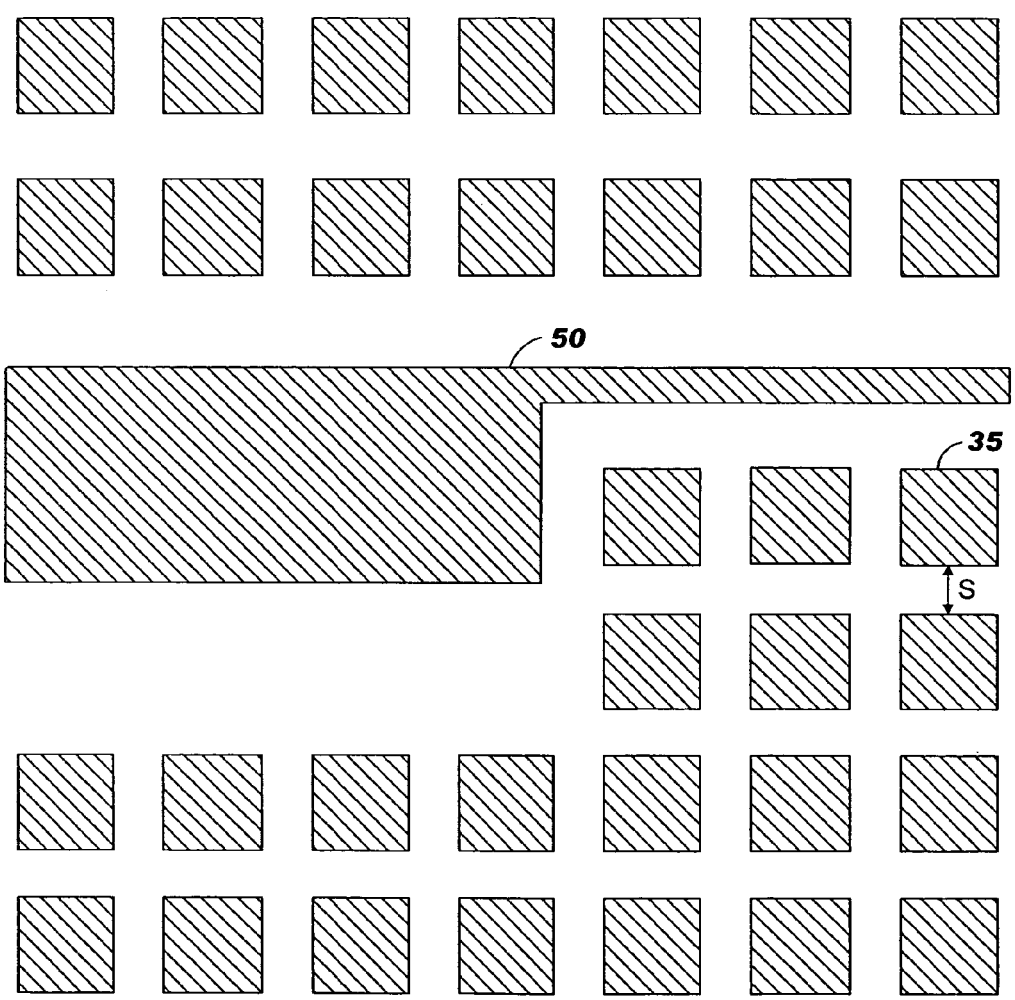
FIG. 2b is a top view of one layer of a device in accordance with the invention.

FIG. 2b is an alternative arrangement of the dummy fill shapes. In this aspect, the dummy fill shapes are aligned with one another in rows and columns, surrounding the interconnect. As discussed with reference to FIG. 2a, the line widths, spacing and the like may have the same or substantially the same properties as discussed above.

FIG. 3 is a final structure of one device in accordance with the invention. Although the description herein describes the concept of everywhere-required small, ubiquitous dummy metal fill shapes in the low-k dielectric levels, different placements of the dummy metal fill shapes are also contemplated by the invention. An emphasis, however, is on the placement of the dummy fill shapes in close proximity to the functional wiring to provide the advantages of the invention.

As thus described, in a first aspect of the invention, a structural securing mechanism includes using dummy fill shapes to physically connect at least one of the oxide layers that are adjacent to the interconnect to another oxide layer of the hybrid oxide/low-k structure. For a hybrid oxide/low-k dielectric stack, the interconnect is located in the low-k layer between oxide layers and the dummy fill shapes in the low-k layers join together the adjacent oxide layers to provide structural support for the interconnect. Thus, structural support is enhanced for an interconnect since the dummy fill shapes located on the same wiring level as the interconnect are used to connect adjacent oxide layers.

By requiring that dummy metal fill shapes be used to fill all or substantially available regions of empty space on the interconnect levels manufactured in the low-k material, CTE-mismatch driven stresses and deflections are significantly reduced, especially in the most susceptible regions, and the robustness and reliability of the resulting hybrid oxide/low-k dielectric structure is significantly improved. The most susceptible regions are very low or abruptly varying metal densities such as those areas where there is only one metal line or those areas where there is a high density of metal lines which abruptly change to a low density of metal lines, respectively. More specifically, by connecting together the silicon oxide layers above and below the dummy metal filled low-k dielectric layer, the silicon oxide layers are effectively inhibited from deflecting, assuming relatively good bonding between the silicon oxide levels and the interposed dummy metal fill shapes. This will reduce the occurrence of deflections associated with any stresses that remain. Also, by replacing the high-CTE low-k material in such regions with relatively low-CTE metal (i.e., copper), the effective CTE of the region is reduced in proportion to the density of the dummy metal fill shapes thus reducing the tendency for temperature-driven stresses. Thus, if the density of dummy metal fill shapes is matched to the overall average local metal density, CTE-mismatch stresses and deflections tend toward zero.

While the invention has been described in terms of embodiments, those skilled in the art will recognize that the invention can be practiced with modifications and in the spirit and scope of the appended claims.

What is claimed:

1. A semiconductor structure, comprising:
   a first rigid dielectric layer;
   a second rigid dielectric layer;
   a first non-rigid low-k dielectric layer formed between the first and second rigid dielectric layer;
   a plurality of dummy fill shapes formed in the first non-rigid layer which replace portions of the first non-rigid low-k dielectric layer with lower coefficient of thermal expansion (CTE) metal such that an overall CTE of the first non-rigid low-k dielectric layer and the plurality of dummy fill shapes matches a CTE of the first and second rigid dielectric layers more closely than that of the first non-rigid low-k dielectric layer alone; and
   an interconnect arranged on the first non-rigid low-k dielectric layer, wherein the dummy fill shapes surround the interconnect and are aligned with one another in rows and columns,
   wherein the dummy fill shapes physically connect together the first and second rigid dielectric layers and have a density of approximately between 45% and 50% of a density of the first non-rigid low-k dielectric layer.

2. A semiconductor structure, comprising:
   a first rigid dielectric layer;
   a second rigid dielectric layer;
   a first non-rigid low-k dielectric layer formed between the first and second rigid dielectric layer;
   a plurality of dummy fill shapes formed in the first non-rigid layer which replace portions of the first non-rigid low-k dielectric layer with lower coefficient of thermal expansion (CTE) metal such that an overall CTE of the first non-rigid low-k dielectric layer and the plurality of dummy fill shapes matches a CTE of the first and second rigid dielectric layers more closely than that of the first non-rigid low-k dielectric layer alone;
   a second non-rigid low-k dielectric layer formed on the second rigid dielectric layer;
   a third rigid dielectric layer formed on the second non-rigid low-k dielectric layer;
   a metal interconnect extending between the second and third rigid dielectric layers and formed in the second non-rigid low-k dielectric layer; and
   additional dummy fill shapes formed in the second non-rigid low-k dielectric layer in proximity to the metal interconnect, the additional dummy fill shapes being formed of a material such that an overall CTE of the at least one dummy fill shape better matches to the second and third rigid dielectric layers than that of the second non-rigid low-k dielectric layer,
   wherein the dummy fill shapes physically connect together the first and second rigid dielectric layers and have a density of approximately between 45% and 50% of a density of the first non-rigid low-k dielectric layer.

3. The semiconductor structure of claim 2, wherein the additional dummy fill shapes are square and arranged in a staggered offset pattern.

4. The semiconductor structure of claim 2, wherein the density of the dummy fill shapes is approximately 45%.

5. The semiconductor structure of claim 2, wherein a size of the additional dummy fill shapes is three times a minimum line width of the first non-rigid low-k dielectric layer.

6. The semiconductor structure of claim 2, wherein the additional dummy fill shapes surround the metal interconnect and are aligned with one another in rows and columns.

7. A semiconductor structure, comprising:
   a first rigid dielectric layer;
   a second rigid dielectric layer;
   a first non-rigid low-k dielectric layer formed between the first and second rigid dielectric layer;
   first dummy fill shapes formed in the first non-rigid layer which replace portions of the first non-rigid low-k dielectric layer with lower coefficient of thermal expansion (CTE) metal such that an overall CTE of the first non-rigid low-k dielectric layer and the first dummy fill shapes matches a CTE of the first and second rigid dielectric layers more closely than that of the first non-rigid low-k dielectric layer alone;
   the first dummy fill shapes physically connecting together the first and second rigid dielectric layers and having a density of approximately between 45% and 50% of a density of the first non-rigid low-k dielectric layer;
   a second non-rigid low-k dielectric layer formed on the second rigid dielectric layer;
   a third rigid dielectric layer formed on the second non-rigid low-k dielectric layer;
   a metal interconnect extending between the second and third rigid dielectric layers and formed in the second non-rigid low-k dielectric layer;
   second dummy fill shapes formed in the second non-rigid low-k dielectric layer in proximity to the metal interconnect; and
   the second dummy fill shapes physically connecting together the second and third rigid dielectric layers and having a density of approximately between 45% and 50% of a density of the second non-rigid low-k dielectric layer.

8. The semiconductor structure of claim 7, wherein a size of the second dummy fill shapes is three times a minimum line width of the second non-rigid low-k dielectric layer.

9. The semiconductor structure of claim 7, wherein the second dummy fill shapes surround the metal interconnect and are aligned with one another in rows and columns.

10. The semiconductor structure of claim 7, wherein the second dummy fill shapes are square and arranged in a staggered offset pattern.

11. A semiconductor structure, comprising:
a first rigid dielectric layer;
a second rigid dielectric layer;
a first non-rigid low-k dielectric layer formed between the first and second rigid dielectric layer;
first dummy fill shapes formed in the first non-rigid layer which replace portions of the first non-rigid low-k dielectric layer with lower coefficient of thermal expansion (CTE) metal such that an overall CTE of the first non-rigid low-k dielectric layer and the first dummy fill shapes matches a CTE of the first and second rigid dielectric layers more closely than that of the first non-rigid low-k dielectric layer alone;
the first dummy fill shapes physically connecting together the first and second rigid dielectric layers and having a density of approximately between 45% and 50% of a density of the first non-rigid low-k dielectric layer;
a second non-rigid low-k dielectric layer formed on the second rigid dielectric layer;
a third rigid dielectric layer formed on the second non-rigid low-k dielectric layer;
a metal interconnect extending between the second and third rigid dielectric layers and formed in the second non-rigid low-k dielectric layer;
second dummy fill shapes formed in the second non-rigid low-k dielectric layer in proximity to the metal interconnect; and
the second dummy fill shapes physically connecting together the second and third rigid dielectric layers and having a density of approximately between 45% and 50% of a density of the second non-rigid low-k dielectric layer,
wherein a size of the second dummy fill shapes is three times a minimum line width of the second non-rigid low-k dielectric layer, and one of:
the second dummy fill shapes surround the metal interconnect and are aligned with one another in rows and columns; and
the second dummy fill shapes are square and arranged in a staggered offset pattern.

* * * * *